US009188614B2

(12) United States Patent
Bellon

(10) Patent No.: US 9,188,614 B2
(45) Date of Patent: Nov. 17, 2015

(54) DATA INPUT DEVICE WITH A POTENTIOMETER, AND JOYSTICK INTENDED FOR PILOTING AN AIRCRAFT, SAID JOYSTICK COMPRISING THE DATA INPUT DEVICE

(71) Applicant: THALES, Neuilly-sur-Seine (FR)

(72) Inventor: Bernard Bellon, Savigny sur Braye (FR)

(73) Assignee: Thales, Courbevoie (FR)

( * ) Notice: Subject to any disclaimer, the term of this patent is extended or adjusted under 35 U.S.C. 154(b) by 199 days.

(21) Appl. No.: 13/708,973

(22) Filed: Dec. 8, 2012

(65) Prior Publication Data

US 2013/0147494 A1 Jun. 13, 2013

(30) Foreign Application Priority Data

Dec. 9, 2011 (FR) ...................................... 11 03775

(51) Int. Cl.
| | |
|---|---|
| G01R 27/28 | (2006.01) |
| G01R 27/02 | (2006.01) |
| G06F 3/038 | (2013.01) |
| G06F 3/0362 | (2013.01) |
| G06F 3/0354 | (2013.01) |
| H01C 10/30 | (2006.01) |
| G01R 27/00 | (2006.01) |

(52) U.S. Cl.
CPC .............. G01R 27/02 (2013.01); G06F 3/0362 (2013.01); G06F 3/0383 (2013.01); G06F 3/03548 (2013.01); H01C 10/30 (2013.01)

(58) Field of Classification Search
CPC .... G01R 27/02; G01R 27/00; G06F 3/03548; G06F 3/0362; G06F 3/0383

USPC ........... 324/76.11–76.83, 459–470, 600, 649, 324/714, 723; 33/1 PT, 311, 706; 73/1.79
See application file for complete search history.

(56) References Cited

U.S. PATENT DOCUMENTS

| | | | | |
|---|---|---|---|---|
| 4,788,826 A | * | 12/1988 | Higdon | ............................ 62/126 |
| 5,146,173 A | * | 9/1992 | Jurkewitz | ...................... 324/714 |
| 6,184,695 B1 | * | 2/2001 | Glaser et al. | ................... 324/713 |

(Continued)

FOREIGN PATENT DOCUMENTS

| | | |
|---|---|---|
| EP | 1887368 A1 | 2/2008 |
| WO | 92/00504 A1 | 1/1992 |

OTHER PUBLICATIONS

Mark Dzidowski "Solving Drive in Proportional (potentiometer) Joysticks", URL:http:/controldeviceseng.com/2010/07/07/solving-drift-in-proportional-potentiometer-joysticks/, Jul. 7, 2010, XP55033428.

*Primary Examiner* — Huy Q Phan
*Assistant Examiner* — Raul Rios Russo
(74) *Attorney, Agent, or Firm* — Baker & Hostetler LLP

(57) ABSTRACT

A data input device is provided, implementing a potentiometer having a first and a second fixed connection point which are respectively situated at each of the ends of the potentiometer, a third fixed connection point situated at an intermediate position on the potentiometer and a fourth, mobile connection point forming a slider. The data input device comprises means converting a position of the slider into an electrical voltage, means for supplying a first fixed voltage to the potentiometer via the third connection point, means for supplying a current source to the potentiometer via the slider, means for measuring a voltage difference between the first and second connection points, the voltage difference forming the electrical voltage that represents the position of the slider.

8 Claims, 2 Drawing Sheets

(56) References Cited

U.S. PATENT DOCUMENTS

| | | |
|---|---|---|
| 6,405,184 B1 * | 6/2002 | Bohme et al. .................. 706/20 |
| 6,629,020 B1 * | 9/2003 | Thomsen ...................... 700/282 |
| 6,838,973 B2 * | 1/2005 | Schweinfurth ............... 338/202 |
| 2005/0046425 A1 * | 3/2005 | Junker ......................... 324/525 |
| 2009/0174390 A1 * | 7/2009 | Virtanen ...................... 324/71.1 |

* cited by examiner

DATA INPUT DEVICE WITH A POTENTIOMETER, AND JOYSTICK INTENDED FOR PILOTING AN AIRCRAFT, SAID JOYSTICK COMPRISING THE DATA INPUT DEVICE

CROSS-REFERENCE TO RELATED APPLICATION

This application claims priority to foreign French patent application No. FR 1103775, filed on Dec. 9, 2011, the disclosure of which is incorporated by reference in its entirety.

FIELD OF THE INVENTION

The invention relates to a data input device implementing a potentiometer. This type of device is used to find the value of a parameter that is liable to change continuously, such as a movement.

BACKGROUND

By way of example, this type of device is found in the field of aeronautics and more precisely in a joystick that is used for piloting aircraft, aeroplanes or helicopters. The pilot manoeuvres this joystick in order to modify the trim of his aircraft. It is essential to have precise knowledge of the position of the joystick in order to reflect the orders from the pilot. The joystick is commonly arranged between the legs of the pilot and has several degrees of freedom, thus allowing the pilot to control several types of mobile elements on his aircraft, such as the ailerons and the elevator. By way of example, the joystick may be mobile on the basis of two rotations or one rotation and one translation. There have recently appeared scaled-down joysticks called minijoysticks, which still allow the pilot to control his aircraft.

The invention is concerned with converting the movements of the joystick into electrical information. More precisely, for each degree of freedom, the joystick has at least one potentiometer allowing the position of the joystick to be converted into electrical information in the form of a DC voltage. The potentiometer may be rotary in order to convert a rotation of the joystick or may be linear in order to convert a translation of a joystick or of a minijoystick.

The invention is not limited to a joystick allowing an aircraft to be piloted. The invention can be implemented for any use of a potentiometer.

It is known practice to apply a DC voltage between the two ends of the potentiometer and to read the voltage that is present on the slider of the potentiometer in order to obtain the sought information. This reading is performed at high impedance in order to avoid losses of linearity between the position of the slider and the voltage that is read. This high impedance results in a very small current which does not allow good continuity to be guaranteed of the contacts. Faults may occur at the level of the contact of the slider in the potentiometer itself or at the level of contacts outside the potentiometer, for example in a connector linking said potentiometer to the environment thereof. The use of gilded contacts allows the quality of the connections to be improved but does not provide a perfect solution to the problems pertaining to the continuity of the contacts.

Moreover, fault detection may be difficult to implement. A continuity fault may become apparent only when the slider is moved, which may be critical to the task of an aircraft. The pilot would thus notice a fault in his joystick only when he wished to manoeuvre his aircraft.

SUMMARY OF THE INVENTION

The invention makes it possible to guarantee a minimum current in the potentiometer while preserving the linearity of the measurement.

To this end, the subject matter of the invention is a data input device comprising:
  a slider,
  means converting a position of the slider into an electrical voltage,
  a potentiometer extending between two ends, the potentiometer having a first and a second fixed connection point which are respectively situated at each of the ends of the potentiometer, a third fixed connection point situated at an intermediate position on the potentiometer between the two ends and a fourth, mobile connection point forming the slider and being able to move between the two ends,
  means for supplying a first fixed voltage to the potentiometer via the third connection point,
  means for supplying a current source to the potentiometer via the slider,
  means for measuring a voltage difference between the first and second connection points, the voltage difference forming the electrical voltage that represents the position of the slider.

Another subject matter of the invention is likewise a joystick intended for piloting an aircraft, said joystick comprising a data input device according to the invention.

BRIEF DESCRIPTION OF THE DRAWINGS

The invention will be better understood and other advantages will emerge upon reading the detailed description of an embodiment provided by way of example, the description being illustrated by the attached drawing, in which.

For the sake of clarity, the same elements will bear the same references throughout the various figures.

DETAILED DESCRIPTION

Figure 1:
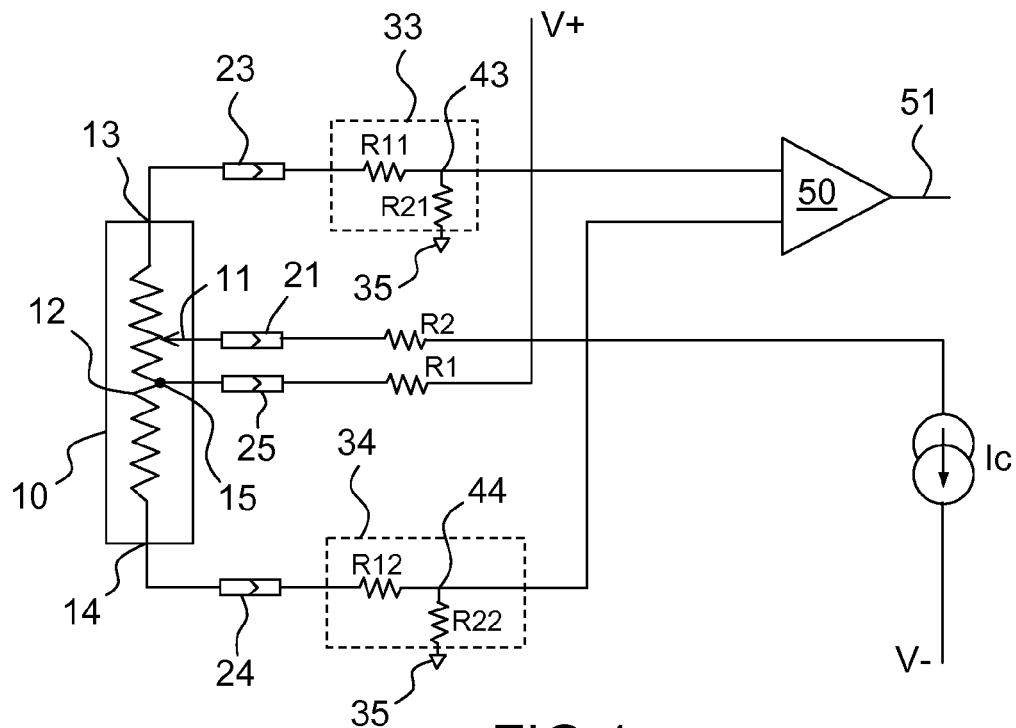
FIG. 1 shows a block diagram of a data input device according to the invention.

FIG. 1 shows a data input device comprising a potentiometer 10, which has a slider 11 that can be moved. The potentiometer 10 comprises a resistor 12 extending between two ends 13 and 14. The slider 11 can move along the resistor 12 in order to provide electrical contact with a current point on the resistor 12 situated between the two ends 13 and 14.

By way of example, in the case of a joystick implemented in the cockpit of an aircraft, the resistor 12 is fixed in relation to the cockpit and the slider 11 is integral with a mobile part of the joystick, a mobile part that is intended to be manoeuvred by a pilot of the aircraft. Alternatively, the resistor 12 may be mobile and the slider 11 may be fixed.

The main function of the data input device is to convert the position of the slider 11 into a piece of electrical information which is used to control an actuator, for example.

The potentiometer 10 has a middle point 15. More specifically, it is possible to make fixed electrical contact with the resistor in the middle thereof. In other words, for a total value R of the resistor 12, there is a value R/2 between each of the ends 13 and 14 and the middle point 15. Alternatively, the invention may be implemented with a fixed connection point which may be situated at a position on the resistor other than in the middle thereof. This connection point is simply situated at an intermediate position between the two ends 13 and 14. It is merely sufficient for this intermediate point to be separate from the two ends 13 and 14.

The device may have a connector comprising four connection terminals 21, 23, 24 and 25, each allowing one of the points on the potentiometer 10, respectively 11, 13, 14 and 15, to be connected to other components of the device. It is likewise possible to do without a connector and to provide a fixed connection, for example by means of soldering.

The device comprises means for supplying a first fixed voltage to the potentiometer 10 via its middle point 15. To this end, a voltage source V+ is connected to the connection terminal 25, and therefore to the middle point 15, by means of a resistor R1.

The device comprises means for supplying a current source to the potentiometer 10 via the slider 11. To this end, a constant current generator Ic is connected to the connection terminal 21, and therefore to the slider 11, by means of a resistor R2. The current generator Ic uses a fixed voltage V− having a negative value in relation to that of the earth 35 in order to set up the current leaving the potentiometer 10 via the slider 11.

The device comprises means for measuring a voltage difference between the ends 13 and 14. This voltage difference forms the electrical voltage that represents the position of the slider 11 between the ends 13 and 14 along the resistor 12 of the potentiometer 10.

Advantageously, in order to measure the voltage difference, the device comprises two voltage dividers 33 and 34. These dividers make it possible to guarantee that a minimum current flows in the ends 13 and 14 of the potentiometer 10. The first divider 33 is connected between the terminal 23 and a fixed voltage, for example formed by an electrical earth 35 of the device. The second divider 34 is connected between the terminal 24 and a fixed voltage, for example likewise formed by the earth 35 of the device.

By way of example, the divider 33 is formed by two resistors R11 and R21 connected in series between the terminal 23 and the earth 35. The common point of the two resistors R11 and R21 forms an intermediate point 43 on the divider 33. In the same way, the divider 34 is formed by two resistors R12 and R22, for example, connected in series between the terminal 14 and the earth 35. The common point of the two resistors R12 and R22 forms an intermediate point 44 on the divider 34.

The two voltage dividers 33 and 34 are advantageously identical. More specifically, on the one hand, the resistors R11 and R12 have the same value and, on the other hand, the resistors R21 and R22 have the same value.

The voltage difference is measured between the two intermediate points 43 and 44, for example by means of a voltmeter 50, an output 51 of which delivers an electrical voltage that represents the position of the slider 11 along the resistor 12.

It is common to arrange voltage sources having opposite values in relation to an earth in a piece of electronic equipment. It is possible to use this type of supply for the device. The voltage V+ forms a positive voltage source, and an opposite voltage source V− is used in order to set up the constant current Ic leaving the potentiometer 10 via the slider 11. The two voltages have opposite values V+ and V− in relation to the earth 35.

Figure 2:
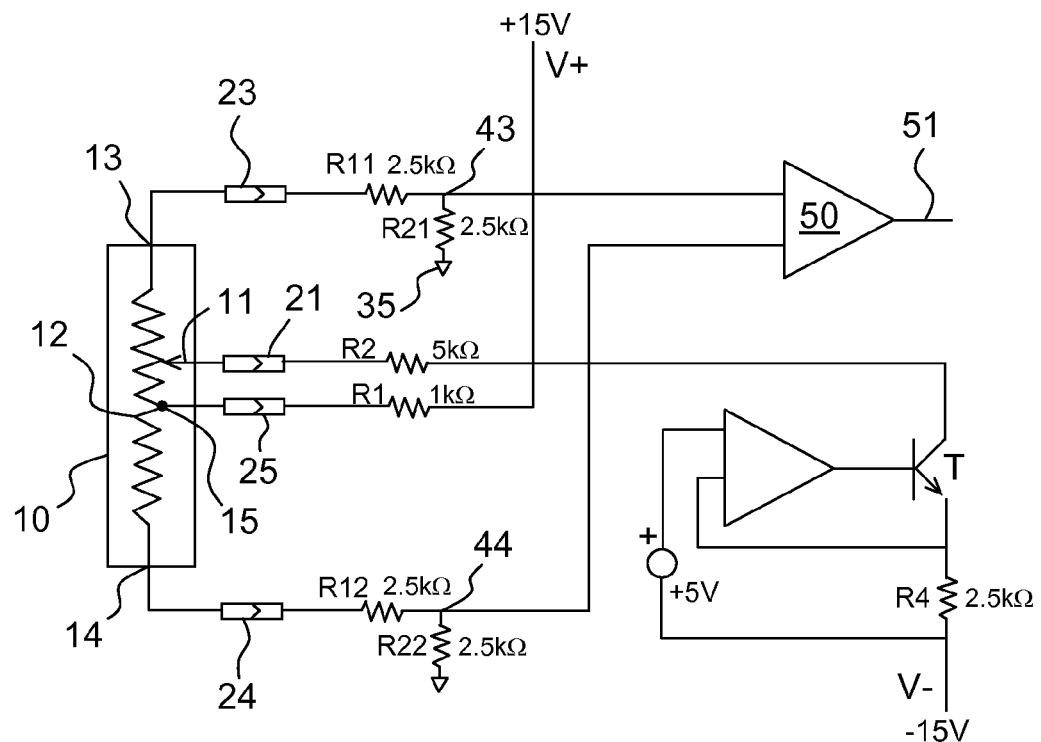
FIG. 2 shows a more specific example of a device based on the block diagram in FIG. 1.

FIG. 2 shows an embodiment of the device in FIG. 1 in which the resistor R1 is chosen to be 1 kΩ, the resistor R2 is chosen to be 5 kΩ and the resistors R11, R21, R12 and R22 are chosen to be 2.5 kΩ.

The current generator Ic is formed by a transistor T connected between the resistor R2 and the voltage source V− by means of a resistor R4, the value of which is chosen to be 2.5 kΩ. The transistor T is driven so as to preserve a constant voltage, in this case 5V, at the terminals of the resistor R4 and therefore a constant current flowing in the resistor R4.

Figure 3:
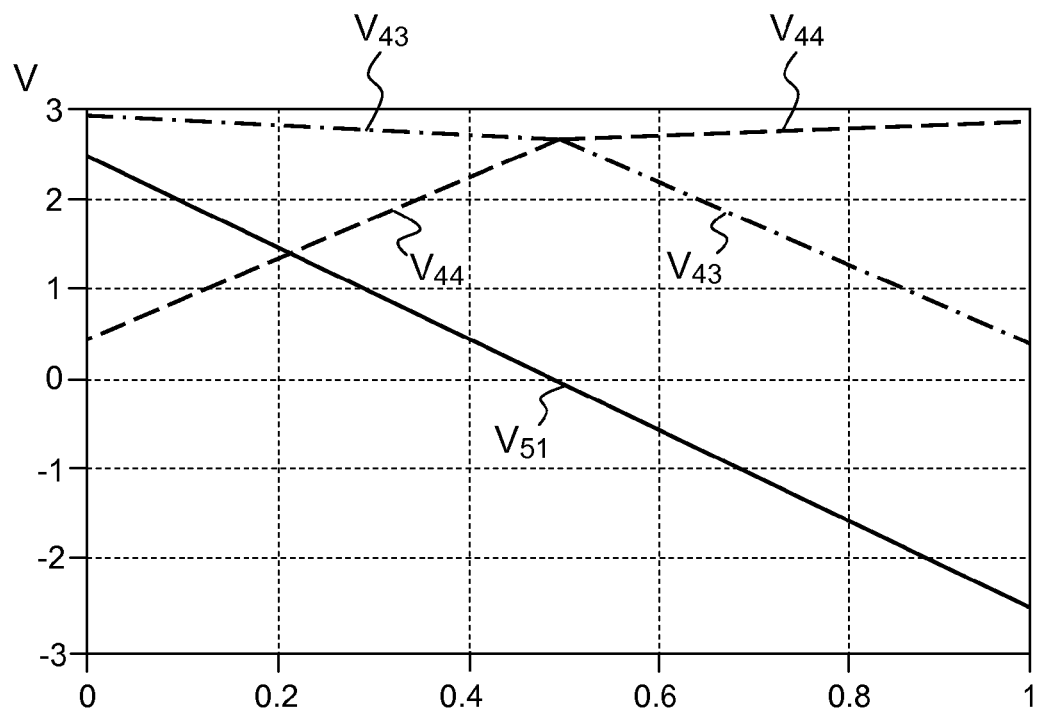
FIGS. 3 and 4 show the change in voltages and currents in the device from FIG. 2.
Figure 4:
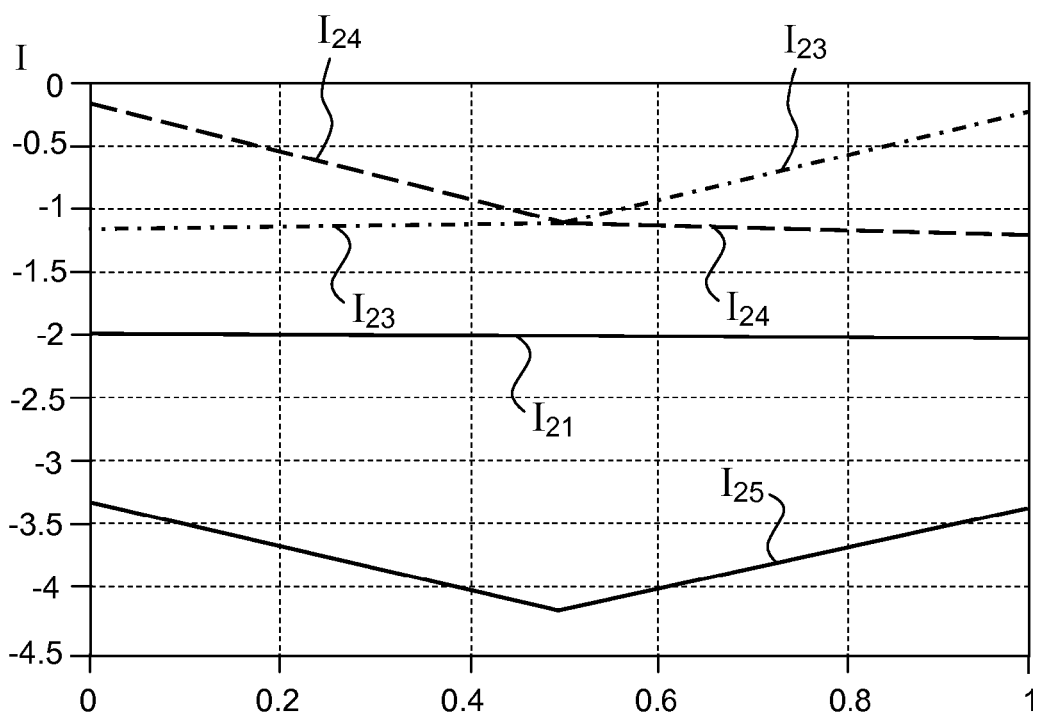

FIGS. 3 and 4 show the change in voltages and currents in the device from FIG. 2 as a function of the position of the slider 11. More specifically, the horizontal axis in these two figures shows the position of the slider 11, which changes as a rule between two values 0 and 1, "0" representing the slider 11 at point 14 and "1" representing the slider 11 at point 13.

In FIG. 3, the vertical axis represents the voltage at certain characteristic points on the device. A chain-line curve shows the change in the voltage $V_{43}$ at point 43, a dashed-line curve shows the change in the voltage $V_{44}$ at point 44, and a solid-line curve shows the change in the voltage $V_{51}$ at point 51. The voltage $V_{51}$ is equal to the difference between the voltages $V_{43}$ and $V_{44}$. It is noted that the change in the voltage $V_{51}$ is quite linear over the whole movement of the slider 11, which is sought-after in order to facilitate the determination of the position of the slider 11.

In FIG. 4, the vertical axis represents the level of the current flowing at certain characteristic points on the device. By convention, the positive direction of the current has been defined when the current returns to the potentiometer 10. The current generator Ic delivers a constant current $I_{21}$ of −2A. A chain-line curve shows the change in the current $I_{23}$ in the connection terminal 23, a dashed-line curve shows the change in the current $I_{24}$ in the connection terminal 24 and a solid-line curve shows the change in the current $I_{25}$ in the connection terminal 25. It is noted that whatever the position of the slider 11, a nonzero current always flows in each of the connection terminals 21, 23, 24 and 25.

The values of the resistors are provided merely by way of example and can be modified as a function of the values of the required voltage amplitude at the input and at the output of the voltmeter 50 and as a function of the levels of the currents that are required to flow in the device.

Advantageously, the device comprises means for measuring the voltage that is present at at least one of the connection terminals and means for comparing the measured value of the voltage with a reference value. Such monitoring allows easy diagnosis of a fault in the device even when the latter is at rest, notably in the case of deterioration and possibly loss of contact at the level of one of the connection terminals 21, 23, 24 or 25. The reason is that any increase in resistance seen from the current source is going to translate into a voltage variation on the monitored connection terminal, such as an increase in the voltage on the connection 21. Monitoring of this voltage will thus allow diagnosis of the faults even without moving the slider 11 of the potentiometer 10.

By way of example, a deterioration in contact on the connection terminal 25, bringing about a contact resistance approaching 1 kΩ, translates into a significant fall, 3V in the example in FIG. 2, in the voltage that is present at the connection terminal 21.

A deterioration in contact on the connection terminal 21, bringing about a contact resistance approaching 1 kΩ, translates into a significant fall, 2V, in the voltage that is present at the connection terminal 21.

In these two cases, the fault detection appears before the loss of precision in the information.

A deterioration on the connection terminals 23 or 24 translates into an increase in the voltage that is present at the connection terminal 21. This parameter is less sensitive. A variation of 10 kΩ will translate into an increase of 470 mV. By contrast, the value that is read will change, which will be able to be detected by redundant monitoring.

The invention claimed is:

1. A data input device comprising:
   a slider,
   means converting a position of the slider into an electrical voltage,
   a potentiometer extending between two ends, the potentiometer having a first and a second fixed connection point which are respectively situated at each of the ends of the potentiometer, a third fixed connection point situated at an intermediate position on the potentiometer between the two ends and a fourth, mobile connection point forming the slider and being able to move between the two ends,
   means for supplying a first fixed voltage to the potentiometer via the third connection point,
   means for supplying a fixed current source to the potentiometer via the slider, and
   means for measuring a voltage difference between the first and second connection points, the voltage difference forming the electrical voltage that represents the position of the slider.

2. The device according to claim 1, wherein the means for measuring a voltage difference between the first and second connection points comprise:
   a first voltage divider, a first end of which is connected to one of the ends of the potentiometer at the first connection point thereof, and a second end of which receives a second fixed voltage, and
   a second voltage divider, a first end of which is connected to the other of the ends of the potentiometer at the first connection point thereof, and a second end of which receives the second fixed voltage,
   wherein the voltage difference is measured between an intermediate point on the first voltage divider and an intermediate point on the second voltage divider.

3. The device according to claim 2, wherein the first fixed voltage has a positive value with respect to that of the second fixed voltage and wherein the current source uses a third fixed voltage having a negative value in relation to that of the second fixed voltage in order to set up a constant current leaving the potentiometer via the slider.

4. The device according to claim 2, wherein the two voltage dividers are identical.

5. The device according to claim 1, wherein the means for supplying a fixed voltage to the potentiometer via the third connection point are connected to the third connection point by means of a resistor.

6. The device according to claim 1, wherein the third fixed connection point forms a middle point on the potentiometer between the two ends.

7. The device according to claim 1, further comprising means for measuring the voltage present at at least one of the connection terminals and means for comparing the measured value of the voltage with a reference value.

8. A joystick intended for piloting an aircraft, comprising a data input device according to claim 1.

* * * * *